(12) United States Patent
Kojo

(10) Patent No.: US 11,637,544 B2
(45) Date of Patent: Apr. 25, 2023

(54) PIEZOELECTRIC RESONATOR DEVICE AND SYSTEM-IN-PACKAGE MODULE INCLUDING THE SAME

(71) Applicant: Daishinku Corporation, Kakogawa (JP)

(72) Inventor: Takuya Kojo, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 1056 days.

(21) Appl. No.: 16/339,714

(22) PCT Filed: Nov. 21, 2017

(86) PCT No.: PCT/JP2017/041828
§ 371 (c)(1),
(2) Date: Apr. 4, 2019

(87) PCT Pub. No.: WO2018/097132
PCT Pub. Date: May 31, 2018

(65) Prior Publication Data
US 2019/0312189 A1    Oct. 10, 2019

(30) Foreign Application Priority Data

Nov. 24, 2016    (JP) .............................. JP2016-227624

(51) Int. Cl.
*H03H 9/05* (2006.01)
*H03H 9/02* (2006.01)
(Continued)

(52) U.S. Cl.
CPC .......... *H03H 9/0523* (2013.01); *H01L 23/04* (2013.01); *H01L 25/00* (2013.01); *H03B 5/32* (2013.01);
(Continued)

(58) Field of Classification Search
CPC ....... H01L 41/047; H01L 23/04; H01L 25/00; H01L 41/053; H01L 41/081;
(Continued)

(56) References Cited

U.S. PATENT DOCUMENTS 8,890,309 B1    11/2014  Mugiya et al.
2006/0151203 A1*  7/2006  Krueger ............... H03H 9/1071
                                                    29/841

(Continued)

FOREIGN PATENT DOCUMENTS

JP        2010-056929 A     3/2010
JP        2010-252051 A    11/2010
(Continued)

OTHER PUBLICATIONS

Machine English Translation of JP2016032154 A published on Mar. 7, 2016 (Year: 2016).*

(Continued)

*Primary Examiner* — Rakesh B Patel
*Assistant Examiner* — Jorge L Salazar, Jr.
(74) *Attorney, Agent, or Firm* — METROLEX IP LAW GROUP, PLLC

(57) ABSTRACT

A crystal oscillator (101) includes: a piezoelectric resonator plate (2) on which a first excitation electrode and a second excitation electrode are formed; a first sealing member (3) covering the first excitation electrode of the piezoelectric resonator plate (2); a second sealing member (4) covering the second excitation electrode of the piezoelectric resonator plate (2); and an internal space (13) formed by bonding the first sealing member (3) to the piezoelectric resonator plate (2) and by bonding the second sealing member (4) to the piezoelectric resonator plate (2), so as to hermetically seal a vibrating part including the first excitation electrode and the second excitation electrode of the piezoelectric resonator (Continued)

plate (2). An electrode pattern (371) including a mounting pad for wire bonding is formed on an outer surface (first main surface (311)) of the first sealing member (3).

7 Claims, 14 Drawing Sheets

(51) Int. Cl.
<table>
<tr><td><i><b>H10N 30/071</b></i></td><td>(2023.01)</td></tr>
<tr><td><i><b>H03H 9/17</b></i></td><td>(2006.01)</td></tr>
<tr><td><i><b>H01L 25/00</b></i></td><td>(2006.01)</td></tr>
<tr><td><i><b>H01L 23/04</b></i></td><td>(2006.01)</td></tr>
<tr><td><i><b>H03B 5/32</b></i></td><td>(2006.01)</td></tr>
</table>

(52) U.S. Cl.
CPC .............. *H03H 9/02* (2013.01); *H03H 9/178* (2013.01); *H10N 30/071* (2023.02); *H10N 30/10513* (2023.02); *H10N 30/87* (2023.02); *H10N 30/88* (2023.02)

(58) Field of Classification Search
CPC ......... H01L 41/311; H01L 2224/26175; H03B 5/32; H03H 9/02; H03H 9/178; H03H 9/0523; H03H 9/0595; H03H 9/0547; H03H 9/1035

USPC ................................. 333/133, 186, 187, 188
See application file for complete search history.

(56) References Cited

U.S. PATENT DOCUMENTS

<table>
<tr><td>2015/0044822 A1</td><td>2/2015</td><td>Mugiya et al.</td></tr>
<tr><td>2018/0034442 A1</td><td>2/2018</td><td>Kojo et al.</td></tr>
<tr><td>2018/0076790 A1</td><td>3/2018</td><td>Kojo et al.</td></tr>
</table>

FOREIGN PATENT DOCUMENTS

<table>
<tr><td>JP</td><td>2013-105768 A</td><td>5/2013</td></tr>
<tr><td>JP</td><td>2013-239947 A</td><td>11/2013</td></tr>
<tr><td>JP</td><td>5527785 B1</td><td>6/2014</td></tr>
<tr><td>JP</td><td>2015-165613 A</td><td>9/2015</td></tr>
<tr><td>JP</td><td>2016-032154 A</td><td>3/2016</td></tr>
<tr><td>JP</td><td>2016-039516 A</td><td>3/2016</td></tr>
<tr><td>WO</td><td>WO 2016/136283 A1</td><td>9/2016</td></tr>
<tr><td>WO</td><td>WO 2016/158010 A1</td><td>10/2016</td></tr>
</table>

OTHER PUBLICATIONS

Machine English Translation of 2013105768 A published on May 30, 2013 (Year: 2013).*

* cited by examiner

PIEZOELECTRIC RESONATOR DEVICE AND SYSTEM-IN-PACKAGE MODULE INCLUDING THE SAME

TECHNICAL FIELD

The present invention relates to a piezoelectric resonator device such as a crystal oscillator and to a System-in-Package (SiP) module including the piezoelectric resonator device.

BACKGROUND ART

Recently, in various electronic devices, the operating frequencies have increased and the package sizes (especially, the heights) have been decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

Also, Patent Document 2 discloses a surface mount type piezoelectric resonator device in which a mounting terminal is provided on a rear surface of the piezoelectric resonator device so as to be mounted on a circuit board.

PRIOR ART DOCUMENTS

Patent Documents

[Patent Document 1] JP 2010-252051 A
[Patent Document 2] JP 2015-165613 A

SUMMARY OF THE INVENTION

Problem to Be Solved by the Invention

It is easy to reduce the thickness of the piezoelectric resonator device having a sandwich structure compared to the conventional type piezoelectric resonator devices. Thus, it is possible to make the device sufficiently thin as a piezoelectric oscillator on which an IC chip as the oscillation circuit is mounted, and the device can be easily housed in the package like a System in a Package (SiP). The conventional type piezoelectric resonator device here means a so-called ceramic package device having a configuration in which a crystal resonator is sealed in a housing of the package made of ceramic.

However, in the SiP, the other devices to be housed are often mounted on the circuit board by wire bonding. Thus, the surface mount type piezoelectric resonator device requires a different mounting method from other devices, which leads to complicated steps of mounting the piezoelectric resonator device on the circuit board.

Also in the piezoelectric resonator device having the sandwich structure, the thickness of the package is small, which is likely to cause capacitive coupling between the wiring that exists on the circuit board (especially when a multilayer circuit board is used). For this reason, it is necessary to take a measure for shielding in order to prevent the capacitive coupling. However, in the surface mount type piezoelectric resonator device, it is difficult to provide a shield electrode for preventing the capacitive coupling because the terminal to be mounted on the circuit board is provided on the bottom surface of the device.

The present invention was made in consideration of the above circumstances, an object of which is to provide a piezoelectric resonator device having a sandwich structure that is suitable for being mounted by a SiP method, and to provide a SiP module including the piezoelectric resonator device.

Means for Solving the Problem

In order to solve the above problem, the present invention provides a piezoelectric resonator device that includes: a piezoelectric resonator plate including a first excitation electrode formed on a first main surface of a substrate; and a second excitation electrode formed on a second main surface of the substrate so as to make a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and by bonding the second sealing member to the piezoelectric resonator plate. The internal space hermetically seals a vibrating part including the first excitation electrode and the second excitation electrode of the piezoelectric resonator plate. A mounting pad for wire bonding is formed on an outer surface of the first sealing member.

With the above-described configuration, by disposing the mounting pad for wire bonding, it is possible to provide the piezoelectric resonator device for wire bonding, not the surface mount type piezoelectric resonator device. Thus, using the wire bonding, the piezoelectric resonator device can be easily housed in the package by the SiP method.

Also, on the mounting surface for wire bonding, a certain height is needed to pull up the wire. Meanwhile, on the surface on which the IC chip is mounted, a certain height is needed as the thickness of the IC chip. Accordingly, it is possible to prevent the height of the piezoelectric resonator device from increasing by mounting the IC chip and the wire bonding pad on the same surface.

Also in the above-described piezoelectric resonator device, a shield electrode may be formed on an outer surface of the second sealing member.

With the above-described configuration, if the circuit board (for example, a multilayer printed circuit board) includes signal wiring that faces the first excitation electrode and the second excitation electrode, it is possible to prevent capacitive coupling between the excitation electrodes and the signal wiring by providing the shield electrode on the outer surface of the second sealing member. In the piezoelectric resonator device having the sandwich structure, the capacitive coupling is likely to occur between the excitation electrodes and other wiring due to the thin structure. Therefore, the above-described shielding measure is effective.

Also in the above-described piezoelectric resonator device, the mounting pad for wire bonding may be disposed so as not to be superimposed on the first excitation electrode and the second excitation electrode.

With the above-described configuration, it is possible to prevent capacitive coupling between the mounting pad for wire bonding and the excitation electrodes, which leads to reduction in characteristic variations of the piezoelectric resonator device caused by the capacitive coupling.

Also in the above-described piezoelectric resonator device, the mounting pad for wire bonding may be disposed so as to face a frame body surrounding the internal space.

With the above-described configuration, since the mounting pad is disposed so as to avoid the internal space of the piezoelectric resonator device and to face the frame body, it is possible to prevent deformation of the piezoelectric resonator device by pressure at the time of wire bonding in the wire bonding step.

Also in the above-described piezoelectric resonator device, an IC chip may be mounted on the outer surface of the first sealing member.

On the mounting surface for wire bonding, a certain height is needed to pull up the wire. Meanwhile, on the surface on which the IC chip is mounted, a certain height is needed as the thickness of the IC chip. Accordingly, it is possible to prevent the height of the piezoelectric resonator device from increasing by mounting the IC chip and the wire bonding pad on the same surface.

Also in the above-described piezoelectric resonator device, a terminal on which the IC chip is mounted may be formed on the outer surface of the first sealing member so as not to be superimposed on the first excitation electrode and the second excitation electrode.

With the above-described configuration, it is possible to prevent capacitive coupling between the excitation electrodes and the terminal on which the IC chip is mounted, which leads to reduction in characteristic variations of the piezoelectric resonator device caused by the capacitive coupling.

Also in the above-described piezoelectric resonator device, a groove may be formed so as to surround the mounting pad for wire bonding.

With the above-described configuration, when the surrounding of the IC chip is molded by a sealing resin, it is possible to prevent the sealing resin from flowing over the mounting pad for wire bonding thanks to the groove formed around the mounting pad for wire bonding.

Also, a SiP module in the present invention includes the above-described piezoelectric resonator device.

Effect of the Invention

In the present invention, by disposing the mounting pad for wire bonding, it is possible to provide the piezoelectric resonator device for wire bonding, not the surface mount type piezoelectric resonator device. Thus, using the wire bonding has an effect that the piezoelectric resonator device can be easily housed in the package by the SiP method.

Also, on the mounting surface for wire bonding, a certain height is needed to pull up the wire. Meanwhile, on the surface on which the IC chip is mounted, a certain height is needed as the thickness of the IC chip. Accordingly, it is possible to prevent the height of the piezoelectric resonator device from increasing by mounting the IC chip and the wire bonding pad on the same surface.

MEANS FOR CARRYING OUT THE INVENTION

Hereinafter, an embodiment of the present invention will be described with reference to the drawings.

Figure 1:
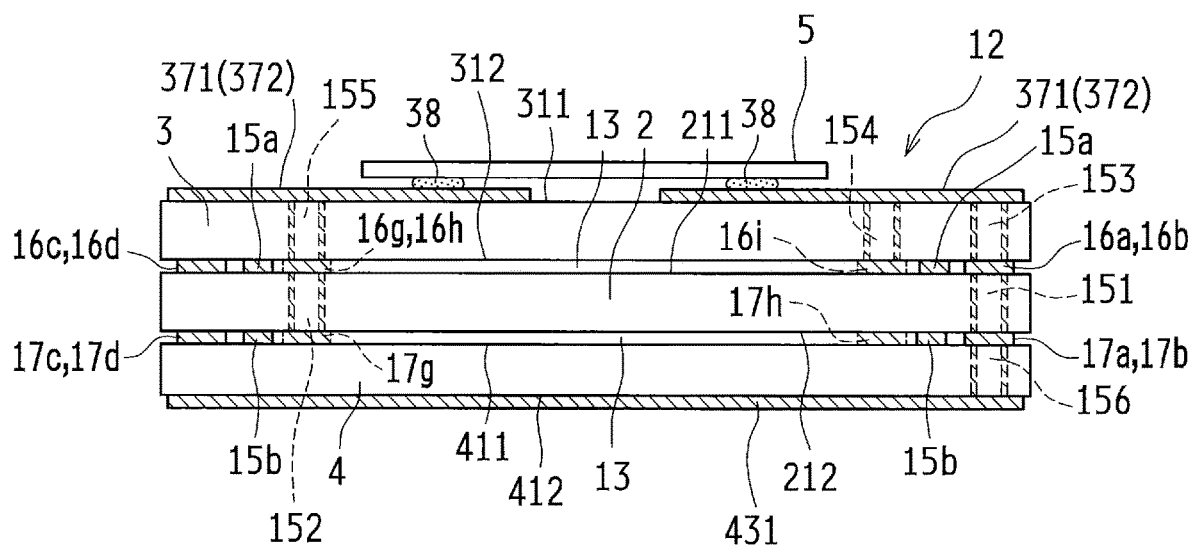
FIG. 1 is a schematic configuration diagram schematically illustrating a configuration of a crystal oscillator according to an embodiment.

FIG. 1 is a schematic configuration diagram schematically illustrating a configuration of a crystal oscillator 101 as a piezoelectric resonator device to which the present invention is applied. In the description below, the crystal oscillator 101 including an IC chip as a constituent element is exemplarily shown as the piezoelectric resonator device. However, the present invention is not limited thereto. The piezoelectric resonator device of the present invention also includes a crystal resonator or the like that does not include any IC chip as a constituent element.

As shown in FIG. 1, the crystal oscillator 101 according to this embodiment includes a crystal resonator plate (piezoelectric resonator plate) 2, a first sealing member 3 and a second sealing member 4. In the crystal oscillator 101, the crystal resonator plate 2 is bonded to the first sealing member 3, and also the crystal resonator plate 2 is bonded to the second sealing member 4. Thus, a package 12 having a sandwich structure is constituted. The first sealing member 3 is bonded to the crystal resonator plate 2 so as to cover a first excitation electrode 221 (see FIG. 4) formed on a first main surface 211 of the crystal resonator plate 2. The second sealing member 4 is bonded to the crystal resonator plate 2 so as to cover a second excitation electrode 222 (see FIG. 5) formed on a second main surface 212 of the crystal resonator plate 2.

In the package 12 as a crystal resonator, an IC chip 5 is mounted on a first main surface 311 of the first sealing member 3. The IC chip 5 as an electronic component element is a one-chip integrated circuit element constituting, with the crystal resonator, an oscillation circuit. The crystal oscillator 101 is constituted of the package 12 as the crystal resonator and the IC chip 5 mounted on the package 12.

In the crystal oscillator 101, the first sealing member 3 and the second sealing member 4 are bonded respectively to the main surfaces (first main surface 211 and second main surface 212) of the crystal resonator plate 2, thus an internal space 13 of the package 12 is formed. In this internal space 13, a vibrating part 22 (see FIGS. 4 and 5) including the first excitation electrode 221 and the second excitation electrode 222 is hermetically sealed. The crystal oscillator 101 according to this embodiment has, for example, a package size of 1.0×0.8 mm, which is reduced in size and height.

Next, the specific configuration of the above-described crystal oscillator 101 is described referring to FIGS. 1 to 7. Here, each of the crystal resonator plate 2, the first sealing member 3 and the second sealing member 4 will be described as a single member.

Figure 4:
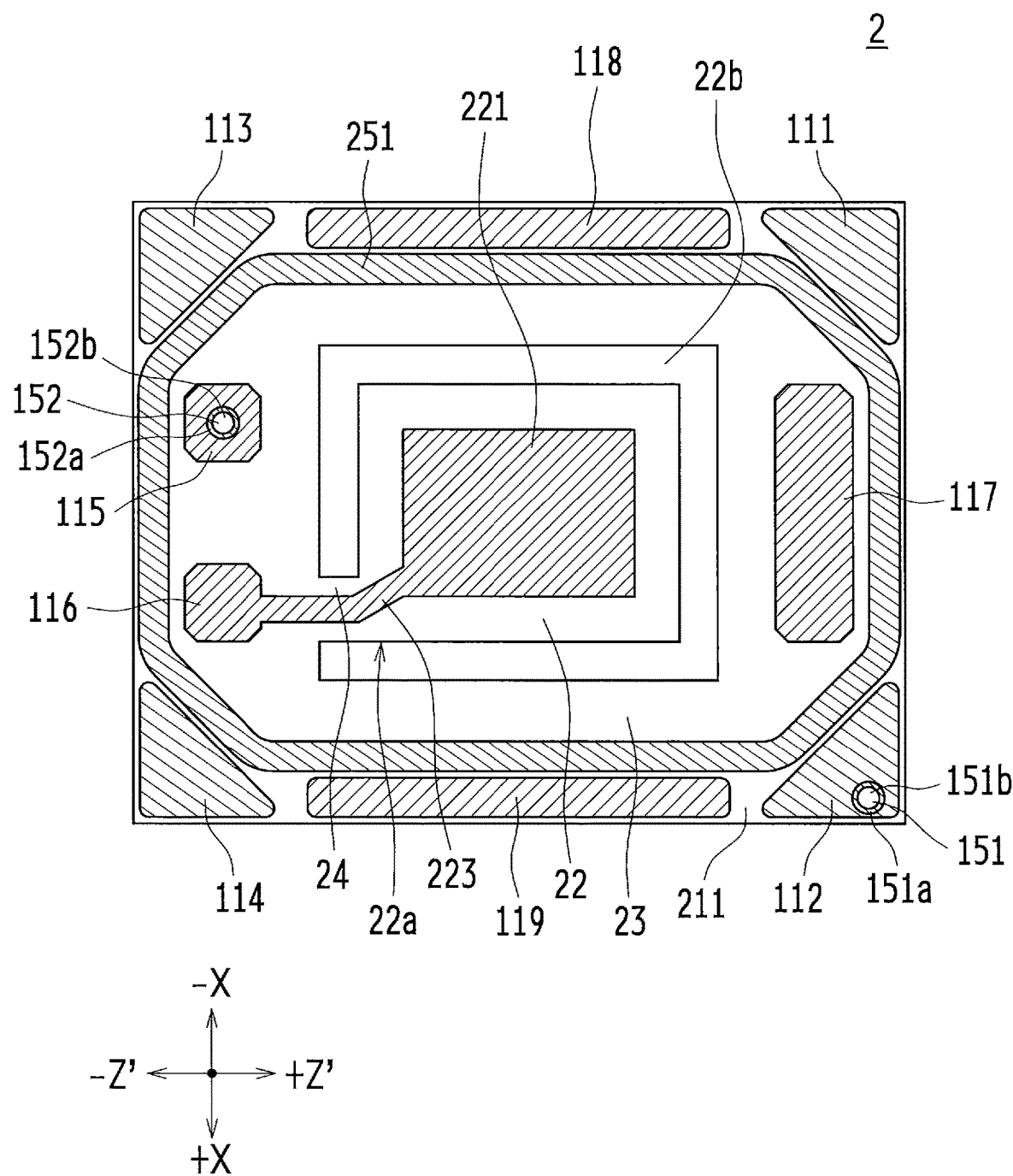
FIG. 4 is a schematic plan view illustrating a crystal resonator plate of the crystal oscillator.
Figure 5:
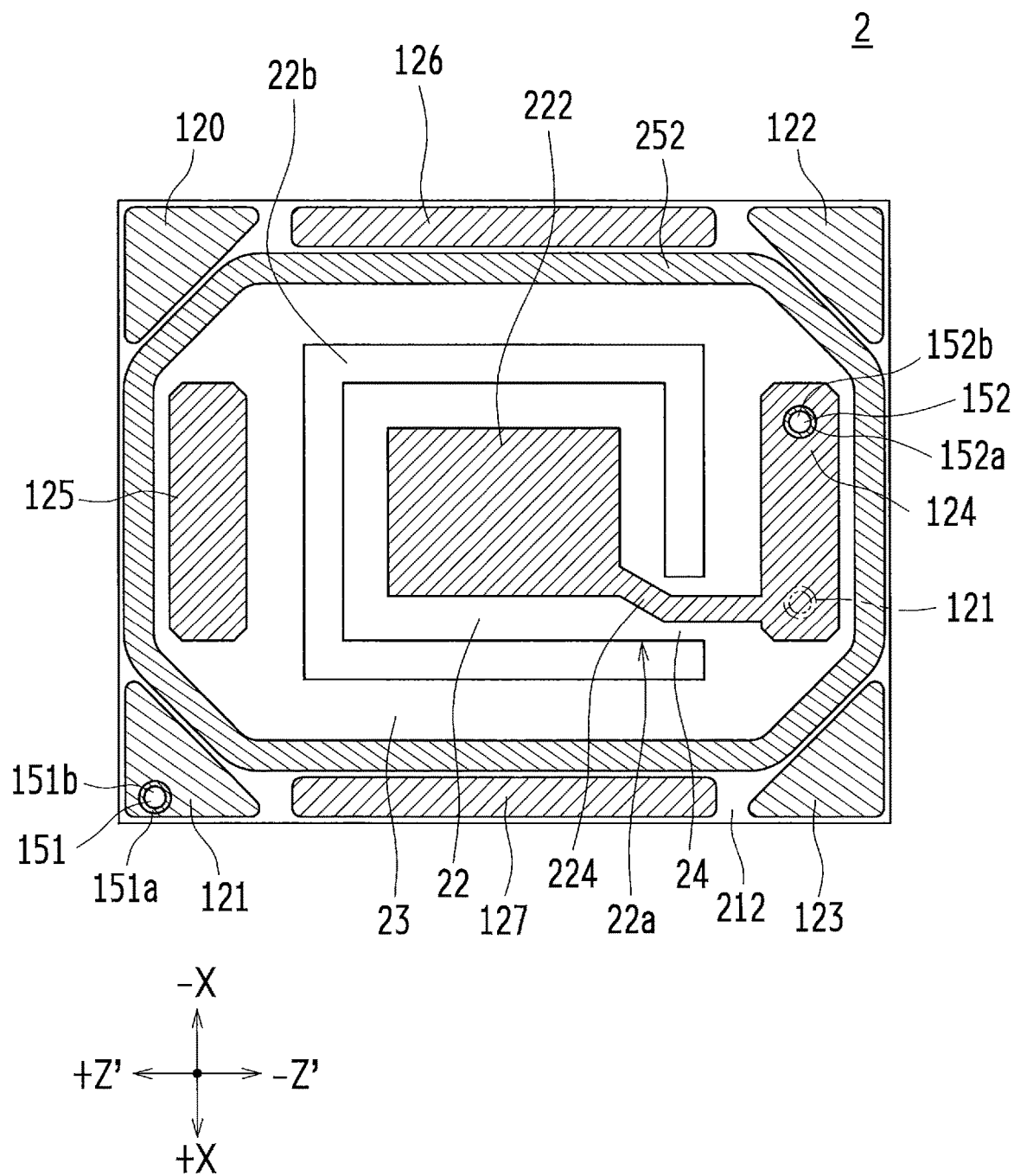
FIG. 5 is a schematic rear view illustrating the crystal resonator plate of the crystal oscillator.

The crystal resonator plate 2 is a piezoelectric substrate made of crystal. As shown in FIGS. 4 and 5, both main surfaces 211 and 212 are formed as smooth flat surfaces (mirror-finished). In this embodiment, an AT-cut crystal plate that causes thickness shear vibration is used as the crystal resonator plate 2. In the crystal resonator plate 2 shown in FIGS. 4 and 5, each main surface 211 and 212 of the crystal resonator plate 2 is an XZ' plane. On this XZ' plane, the lateral direction (short side direction) of the crystal resonator plate 2 is the X axis direction, and the longitudinal direction (long side direction) of the crystal resonator plate 2 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the directions in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting part 24 that connects the vibrating part 22 to the external frame part 23. The vibrating part 22, the connecting part 24 and the external frame part 23 are integrally formed. In this embodiment, the connecting part 24 is provided at only one position between the vibrating part 22 and the external frame part 23, and the remaining part between the vibrating part 22 and the external frame part 23 on which the connecting part 24 is not provided is made as a space (clearance) 22b. Although it is not shown in the drawings, the vibrating part 22 and the connecting part 24 are formed so as to have the thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) from only one corner part 22a positioned in the +X direction and in the −Z' direction of the vibrating part 22 to the external frame part 23 in the −Z' direction. Thus, since the connecting part 24 is disposed on the corner part 22a where displacement of the piezoelectric vibration is relatively small in an outer peripheral edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively.

The first excitation electrode 221 is provided on the first main surface of the vibrating part 22 while the second excitation electrode 222 is provided on the second main surface of the vibrating part 22. Extraction electrodes (a first extraction electrode 223 and a second extraction electrode 224) are respectively connected to the first excitation electrode 221 and the second excitation electrode 222. The first extraction electrode 223 is drawn from the first excitation electrode 221 and connected to a connection bonding pattern 116 formed on the external frame part 23 via the connecting part 24. The second extraction electrode 224 is drawn from the second excitation electrode 222 and connected to a connection bonding pattern 124 formed on the external frame part 23 via the connecting part 24. The first excitation electrode 221 and the first extraction electrode 223 are constituted of a base PVD film deposited on the first main surface 211 by physical vapor deposition, and an electrode PVD film deposited on the base PVD film by the physical vapor deposition. The second excitation electrode 222 and the second extraction electrode 224 are constituted of a base PVD film deposited on the second main surface 212 by the physical vapor deposition, and an electrode PVD film deposited on the base PVD film by the physical vapor deposition.

Resonator-plate-side sealing parts to bond the crystal resonator plate 2 respectively to the first sealing member 3 and the second sealing member 4 are provided on the respective main surfaces 211 and 212 of the crystal resonator plate 2. The resonator-plate-side sealing parts include: a resonator-plate-side first bonding pattern 251 formed on the first main surface 211 of the crystal resonator plate 2; and a resonator-plate-side second bonding pattern 252 formed on the second main surface 212 of the crystal resonator plate 2. The resonator-plate-side first bonding pattern 251 and the resonator-plate-side second bonding pattern 252 are each formed on the external frame part 23 so as to have an annular shape in plan view. The first excitation electrode 221 and the second excitation electrode 222 are not electrically connected to the resonator-plate-side first bonding pattern 251 and the resonator-plate-side second bonding pattern 252.

The resonator-plate-side first bonding pattern 251 is constituted of a base PVD film deposited on the first main surface 211 by the physical vapor deposition, and an electrode PVD film deposited on the base PVD film by the physical vapor deposition. The resonator-plate-side second bonding pattern 252 is constituted of a base PVD film deposited on the second main surface 212 by the physical vapor deposition, and an electrode PVD film deposited on the base PVD film by the physical vapor deposition. That is, the resonator-plate-side first bonding pattern 251 and the resonator-plate-side second bonding pattern 252 have the same configuration in which a plurality of layers is laminated on each main surface 211 and 212, specifically, a Ti (titanium) layer and an Au (gold) layer are deposited by the vapor deposition in this order from the lowermost layer side.

Like this, in the resonator-plate-side first bonding pattern 251 and the resonator-plate-side second bonding pattern 252, each base PVD film is made of a single material (Ti), each electrode PVD film is made of a single material (Au), and the electrode PVD film has a thickness greater than the thickness of the base PVD film. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration so that they are collectively formed in the same process. Similarly to the above, the second excitation electrode 222, the second extraction electrode 224 and the resonator-plate-side second bonding pattern 252 can have the same configuration so that they are collectively formed in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

As shown in FIG. 4, nine connection bonding patterns 111 to 119 are formed on the first main surface 211 of the crystal resonator plate 2, apart from the first excitation electrode 221, the first extraction electrode 223 and the resonator-plate-side first bonding pattern 251. The connection bonding patterns 111 to 114 are respectively disposed on the external frame part 23, at the four corners (corner parts) of the crystal resonator plate 2. The connection bonding patterns 111 to 114 are each provided at a predetermined interval from the resonator-plate-side first bonding pattern 251.

The connection bonding patterns 115 and 116 are disposed on the external frame part 23 of the crystal resonator plate 2, on the −Z' direction side relative to the vibrating part 22 of the crystal resonator plate 2. Also, the connection bonding patterns 115 and 116 are aligned in the X axis direction such that the connection bonding pattern 115 is arranged on the −X direction side and that the connection bonding pattern 116 is arranged on the +X direction side. As described above, the connection bonding pattern 116 is connected to the first extraction electrode 223.

The connection bonding pattern 117 is disposed on the side opposite to the connection bonding patterns 115 and 116 in the Z' axis direction with the vibrating part 22 of the crystal resonator plate 2 being interposed therebetween (i.e. on the side in the +Z' direction of the vibrating part 22 of the crystal resonator plate 2). The connection bonding pattern 117 extends on the external frame part 23 of the crystal resonator plate 2 in the X axis direction.

The connection bonding patterns 118 and 119 are disposed on the external frame part 23 of the crystal resonator plate 2, on both sides in the X axis direction relative to the vibrating part 22. The connection bonding patterns 118 and 119 are provided on regions close to the respective long sides (regions along the respective long sides) of the crystal resonator plate 2, and extend in the Z' axis direction. The connection bonding pattern 118 is disposed between the connection bonding pattern 111 and the connection bonding pattern 113 formed on the first main surface 211 of the crystal resonator plate 2. The connection bonding pattern 119 is disposed between the connection bonding pattern 112 and the connection bonding pattern 114.

As shown in FIG. 5, eight connection bonding patterns 120 to 127 are formed on the second main surface 212 of the crystal resonator plate 2, apart from the second excitation electrode 222, the second extraction electrode 224 and the resonator-plate-side second bonding pattern 252. The connection bonding patterns 120 to 123 are respectively disposed on the external frame part 23, at the four corners (corner parts) of the crystal resonator plate 2. The connection bonding patterns 120 to 123 are each provided at a predetermined interval from the resonator-plate-side second bonding pattern 252.

The connection bonding patterns 124 and 125 are disposed on the external frame part 23 of the crystal resonator plate 2, on both sides in the Z' direction relative to the vibrating part 22 of the crystal resonator plate 2. Specifically, the connection bonding pattern 124 is arranged on the −Z' direction side while the connection bonding pattern 125 is arranged on the +Z' direction side. The connection bonding patterns 124 and 125 extend in the X axis direction. As described above, the connection bonding pattern 124 is connected to the second extraction electrode 224.

The connection bonding patterns 126 and 127 are disposed on the external frame part 23 of the crystal resonator plate 2, on both sides in the X axis direction relative to the vibrating part 22. The connection bonding patterns 126 and 127 are provided on regions close to the respective long sides (regions along the respective long sides) of the crystal resonator plate 2, and extend in the Z' axis direction. The connection bonding pattern 126 is disposed between the connection bonding pattern 120 and the connection bonding pattern 122 formed on the first main surface 211 of the crystal resonator plate 2. The connection bonding pattern 127 is disposed between the connection bonding pattern 121 and the connection bonding pattern 123.

The connecting bonding patterns 111 to 127 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each of the connecting bonding patterns 111 to 127 is constituted of a base PVD film deposited on the corresponding main surface (the first main surface 211 or the second main surface 212) of the crystal resonator plate 2 by the physical vapor deposition, and an electrode PVD film deposited on the base PVD film by the physical vapor deposition.

Also, as shown in FIGS. 4 and 5, two through holes (first and second through holes 151 and 152) are formed in the crystal resonator plate 2 so as to penetrate between the first main surface 211 and the second main surface 212. The first through hole 151 is formed in the region where the connection bonding patterns 112 and 121 are superimposed on each other so as to establish conduction between the connection bonding pattern 112 and the connection bonding pattern 121. The second through hole 152 is formed in the region where the connection bonding patterns 115 and 124 are superimposed on each other so as to establish conduction between the connection bonding pattern 115 and the connection bonding pattern 124.

In the first and second through holes 151 and 152, through electrodes 151a and 152a are respectively formed along a corresponding inner wall surface so as to establish conduction between the electrodes formed on the first main surface 211 and the second main surface 212. Respective central parts of the first and second through holes 151 and 152 are hollow through parts 151b and 152b penetrating between the first main surface 211 and the second main surface 212.

In the crystal oscillator 101, the first through hole 151 and the connection bonding patterns 111 to 114, 118 to 123, 126 and 127 are disposed outside the outer peripheries of the resonator-plate-side first bonding pattern 251 and the resonator-plate-side second bonding pattern 252. The second through hole 152 and the connection bonding patterns 115 to 117, 124 and 125 are disposed inside the inner peripheries of the resonator-plate-side first bonding pattern 251 and the resonator-plate-side second bonding pattern 252. The connection bonding patterns 111 to 127 are not electrically connected to the resonator-plate-side first bonding pattern 251 and the resonator-plate-side second bonding pattern 252.

Figure 2:
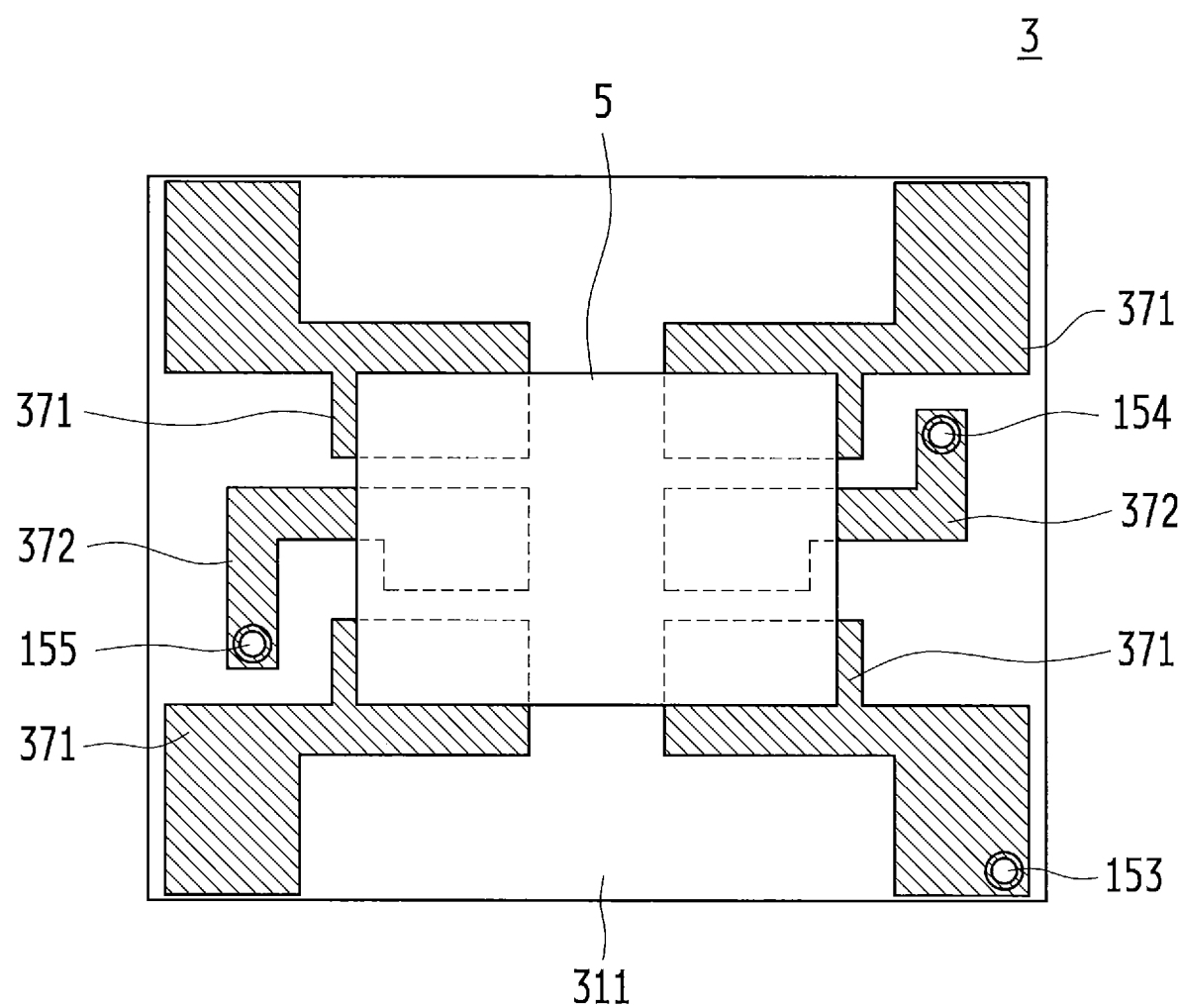
FIG. 2 is a schematic plan view illustrating a first sealing member of the crystal oscillator.
Figure 3:
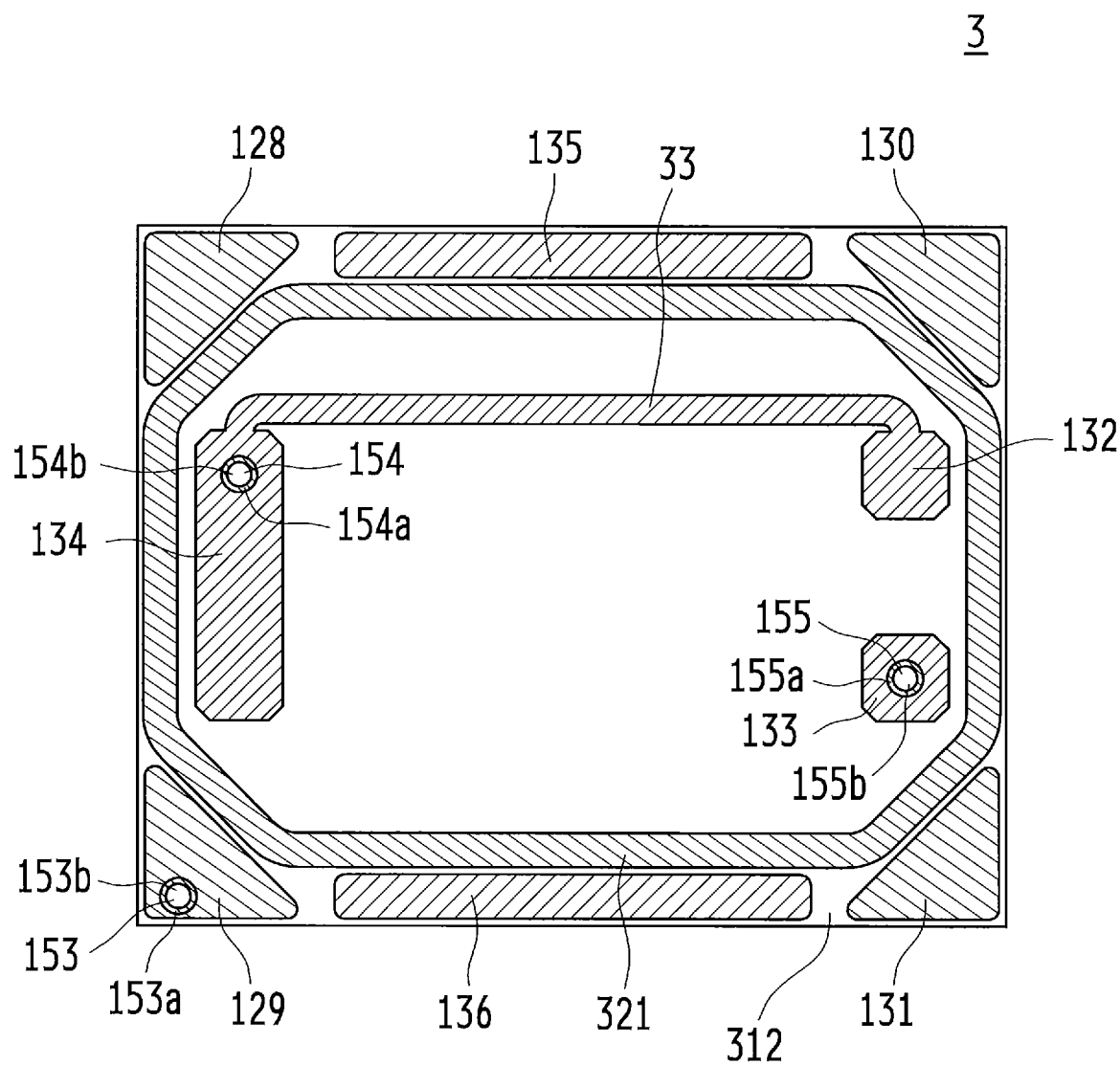
FIG. 3 is a schematic rear view illustrating the first sealing member of the crystal oscillator.
Figure 3:
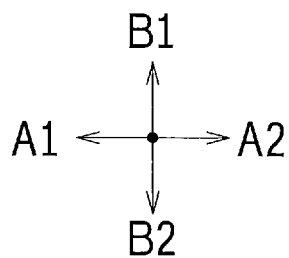

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first bonding pattern 321 is formed as a sealing-member-side first sealing part so as to be bonded to the crystal resonator plate 2. The sealing-member-side first bonding pattern 321 is formed so as to have an annular shape in plan view. The sealing-member-side first bonding pattern 321 is constituted of a base PVD film deposited on the first sealing member 3 by the physical vapor deposition, and an electrode PVD film deposited on the base PVD film by the physical vapor deposition. In this embodiment, the base PVD film is made of Ti, and the electrode PVD film is made of Au. Also, the sealing-member-side first bonding pattern 321 does not contain Sn.

A shown in FIG. 2, on the first main surface 311 (the surface on which the IC chip 5 is mounted) of the first sealing member 3, six electrode patterns (i.e. four electrode patterns 371 and two electrode patterns 372) are formed, which include mounting pads on which the IC chip 5 as an oscillation circuit element is mounted. The four electrode patterns 371 are electrode patterns through which the crystal oscillator 101 is mounted on a circuit board (not shown) by wire bonding. The electrode patterns 371 each have, at one end (an end on the center side), a mounting pad on which the IC chip 5 is mounted. Also, the electrode patterns 371 each have a wire bonding pad at the other end (an end on the peripheral side). The two electrode patterns 372 are electrode patterns through which the IC chip 5 is connected to the first excitation electrode 221 and the second excitation electrode 222. The electrode patterns 372 each have, at one end (an end on the center side), a mounting pad on which the IC chip 5 is mounted. The IC chip 5 is bonded to the electrode patterns 371 and 372 by the flip chip bonding (FCB) method using a metal bump (for example, Au bump) 38 (see FIG. 1).

In the case in which the piezoelectric resonator device of the present invention is a crystal resonator that does not mount the IC chip, this crystal resonator is connected to an IC chip that is mounted on a circuit board as a separate chip, and thus functions as an oscillator. In this case, only the electrode patterns that are connected to the first excitation electrode 221 and the second excitation electrode 222 of the crystal resonator are formed on the first main surface 311 of the first sealing member 3, and these electrode patterns are connected to the IC chip.

As shown in FIG. 3, nine connection bonding patterns 128 to 136 and a wiring pattern 33 are formed on the second main surface 312 of the first sealing member 3, apart from the sealing-member-side first bonding pattern 321. The connection bonding patterns 128 to 131 are respectively disposed at the four corners (corner parts) of the first sealing member 3. The connection bonding patterns 128 to 131 are each provided at a predetermined interval from the sealing-member-side first bonding pattern 321.

The connection bonding patterns 132 and 133 are disposed on the A2 direction side of the first sealing member 3. Also, the connection bonding patterns 132 and 133 are aligned in the B axis direction such that the connection bonding pattern 132 is arranged on the B1 direction side and that the connection bonding pattern 133 is arranged on the B2 direction side. Note that the A1 direction and the A2 direction in FIG. 3 respectively correspond to the +Z' direction and the −Z' direction in FIG. 4 while the B1 direction and the B2 direction respectively correspond to the −X direction and +X direction in FIG. 4.

The connection bonding pattern 134 is disposed on the A1 direction side of the first sealing member 3, and extends in the B axis direction. Also, between the connection bonding pattern 132 and the connection bonding pattern 134, the wiring pattern 33 is formed integrally with the connection bonding patterns 132 and 134. That is, the connection bonding pattern 132 is connected to the wiring pattern 33 on the A2 direction side while the connection bonding pattern 134 is connected to the wiring pattern 33 on the A1 direction side.

The connection bonding patterns 135 and 136 are disposed on both sides in the B axis direction of the first sealing member 3. The connection bonding patterns 135 and 136 are provided on regions close to the respective long sides (regions along the respective long sides) of the first sealing member 3, and extend in the A axis direction. The connection bonding pattern 135 is disposed between the connection bonding pattern 128 and the connection bonding pattern 130 formed on the second main surface 312 of the first sealing member 3. The connection bonding pattern 136 is disposed between the connection bonding pattern 129 and the connection bonding pattern 131.

The connection bonding patterns 128 to 136 have the same configuration as the sealing-member-side first bonding pattern 321, accordingly, they can be formed by the same process as that for the sealing-member-side first bonding pattern 321. Specifically, each of the connection bonding patterns 128 to 136 is constituted of a base PVD film deposited on the second main surface 312 of the first sealing member 3 by the physical vapor deposition, and an electrode PVD film deposited on the base PVD film by the physical vapor deposition.

Also, as shown in FIGS. 2 and 3, three through holes (third to fifth through holes 153 to 155) are formed in the first sealing member 3 so as to penetrate between the first main surface 311 and the second main surface 312. The third through hole 153 is formed in the region where one of the electrode patterns 371 (the one at the lower right in FIG. 2) and the connection bonding pattern 129 are superimposed on each other so as to establish conduction between the electrode pattern 371 and the connection bonding pattern 129. The fourth through hole 154 is formed in the region where one of the electrode patterns 372 (the one on the right side in FIG. 2) and the connection bonding pattern 134 are superimposed on each other so as to establish conduction between the electrode pattern 372 and the connection bonding pattern 134. The fifth through hole 155 is formed in the region where the other of the electrode patterns 372 (the one on the left side in FIG. 2) and the connection bonding pattern 133 are superimposed on each other so as to establish conduction between the electrode pattern 372 and the connection bonding pattern 133.

In the third to fifth through holes 153 to 155, through electrodes 153a to 155a are respectively formed along a corresponding inner wall surface so as to establish conduction between the electrodes formed on the first main surface 311 and the second main surface 312, as shown in FIG. 3. Respective central parts of the third to fifth through holes 153 to 155 are hollow through parts 153b to 155b penetrating between the first main surface 311 and the second main surface 312.

In the crystal oscillator 101, the third through hole 153 and the connection bonding patterns 128 to 131, 135 and 136 are disposed outside the outer periphery of the sealing-member-side first bonding pattern 321. The fourth and fifth through holes 154 and 155, the connection bonding patterns 132 to 134 and the wiring pattern 33 are disposed inside the inner periphery of the sealing-member-side first bonding pattern 321. The connection bonding patterns 128 to 136 are not electrically connected to the sealing-member-side first bonding pattern 321. Also, the wiring pattern 33 is not electrically connected to the sealing-member-side first bonding pattern 321.

Figure 6:
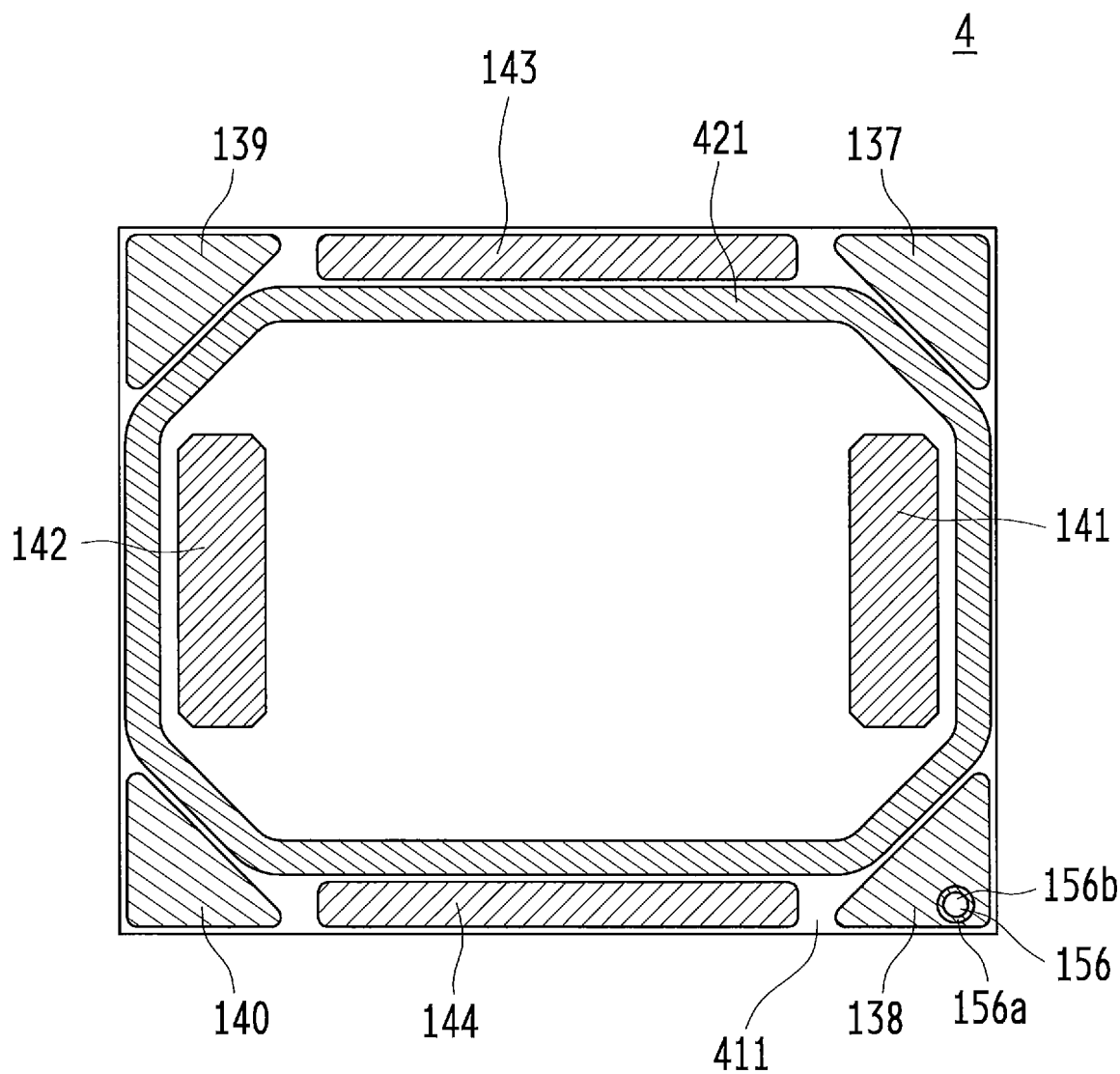
FIG. 6 is a schematic plan view illustrating a second sealing member of the crystal oscillator.
Figure 6:
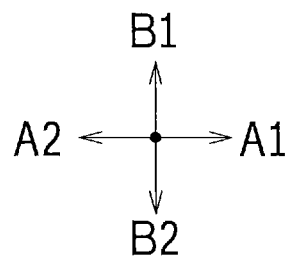
Figure 7:
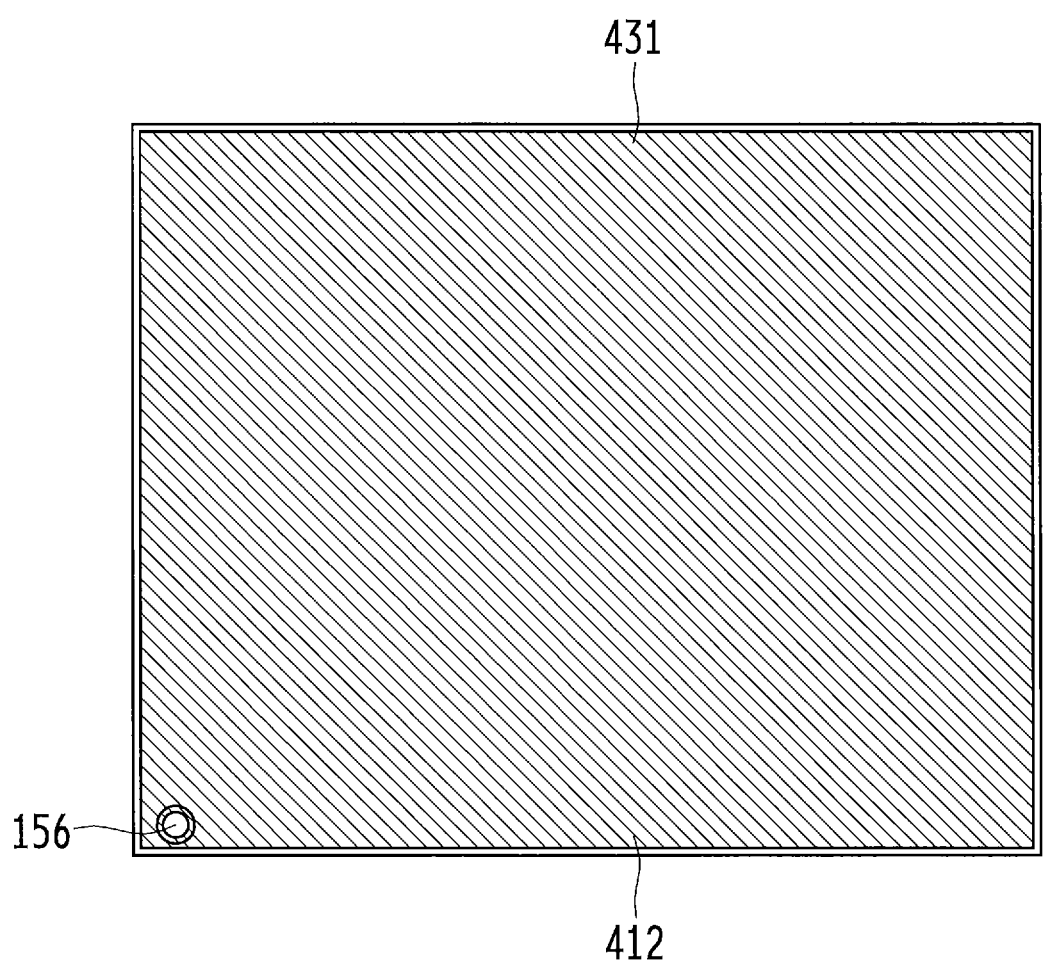
FIG. 7 is a schematic rear view illustrating the second sealing member of the crystal oscillator.
Figure 7:
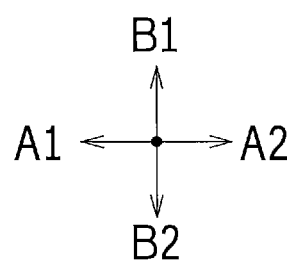

The second sealing member 4 is made of a material having the flexural rigidity (moment of inertia of area× Young's modulus) of not more than 1000 [N·mm$^2$]. Specifically, as shown in FIGS. 6 and 7, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second bonding pattern 421 is formed as a sealing-member-side second sealing part so as to be bonded to the crystal resonator plate 2. The sealing-member-side second bonding pattern 421 is formed so as to have an annular shape in plan view. The sealing-member-side second bonding pattern 421 is constituted of a base PVD film deposited on the second sealing member 4 by the physical vapor deposition, and an electrode PVD film deposited on the base PVD film by the physical vapor deposition. In this embodiment, the base PVD film is made of Ti, and the electrode PVD film is made of Au. Also, the sealing-member-side second bonding pattern 421 does not contain Sn.

As shown in FIG. 6, eight connection bonding patterns 137 to 144 are formed on the first main surface 411 of the second sealing member 4, apart from the sealing-member-side second bonding pattern 421. The connection bonding patterns 137 to 140 are respectively disposed at the four corners (corner parts) of the second sealing member 4. The connection bonding patterns 137 to 140 are each provided at a predetermined interval from the sealing-member-side second bonding pattern 421.

The connection bonding patterns 141 and 142 are respectively disposed on both sides in the A2 direction of the second sealing member 4. Also, the connection bonding patterns 141 and 142 extend in the B axis direction. Here, the connection bonding pattern 141 is arranged on the A1 direction side while the connection bonding pattern 142 is arranged on the A2 direction side. Note that the A1 direction and the A2 direction in FIG. 6 respectively correspond to the +Z' direction and the −Z' direction in FIG. 4 while the B1 direction and the B2 direction respectively correspond to the −X direction and +X direction in FIG. 4.

The connection bonding patterns 143 and 144 are disposed on both sides in the B axis direction of the second sealing member 4. The connection bonding patterns 143 and 144 are provided on regions close to the respective long sides (regions along the respective long sides) of the second sealing member 4, and extend in the A axis direction. The connection bonding pattern 143 is disposed between the connection bonding pattern 137 and the connection bonding pattern 139 formed on the first main surface 411 of the second sealing member 4. The connection bonding pattern 144 is disposed between the connection bonding pattern 138 and the connection bonding pattern 140.

The connection bonding patterns 137 to 144 have the same configuration as the sealing-member-side second bonding pattern 421, accordingly, they can be formed by the same process as that for the sealing-member-side second bonding pattern 421. Specifically, each of the connection bonding patterns 137 to 144 is constituted of a base PVD film deposited on the first main surface 411 of the second sealing member 4 by the physical vapor deposition, and an electrode PVD film deposited on the base PVD film by the physical vapor deposition.

One shield electrode 431 is disposed on a second main surface 412 (the outer main surface not facing the crystal resonator plate 2) of the second sealing member 4. The shield electrode 431 is constituted of a base PVD film deposited on the second main surface 412 by the physical vapor deposition, and an electrode PVD film deposited on the base PVD film by the physical vapor deposition.

Also, as shown in FIGS. 6 and 7, one through hole (sixth through hole 156) is formed in the second sealing member 4 so as to penetrate between the first main surface 411 and the second main surface 412. The sixth through hole 156 is formed in the region where the connection bonding pattern 138 and the shield electrode 431 are superimposed on each other so as to establish conduction between the connection bonding pattern 138 and the shield electrode 431.

In the sixth through hole 156, a through electrode 156a is formed along an inner wall surface so as to establish conduction between the electrodes formed on the first main surface 411 and the second main surface 412, as shown in FIG. 6. A central part of the sixth through hole 156 is a hollow through part 156b penetrating between the first main surface 411 and the second main surface 412.

In the crystal oscillator 101, the sixth through hole 156 and the connection bonding patterns 137 to 140, 143 and 144 are disposed outside the outer periphery of the sealing-member-side second bonding pattern 421. The connection bonding patterns 141 and 142 are disposed inside the inner periphery of the sealing-member-side second bonding pattern 421. The connection bonding patterns 137 to 144 are not electrically connected to the sealing-member-side second bonding pattern 421.

In the crystal oscillator 101 including the crystal resonator plate 2, the first sealing member 3 and the second sealing member 4, the crystal resonator plate 2 and the first sealing member 3 are subjected to the diffusion bonding in a state in which the resonator-plate-side first bonding pattern 251 and the sealing-member-side first bonding pattern 321 are superimposed on each other, and the crystal resonator plate 2 and the second sealing member 4 are subjected to the diffusion bonding in a state in which the resonator-plate-side second bonding pattern 252 and the sealing-member-side second bonding pattern 421 are superimposed on each other, thus, the package 12 having the sandwich structure is produced. Thus, the internal space 13 of the package 12, i.e. the space to house the vibrating part 22 is hermetically sealed without using, separately, any special bonding material such as an adhesive.

Figure 8:
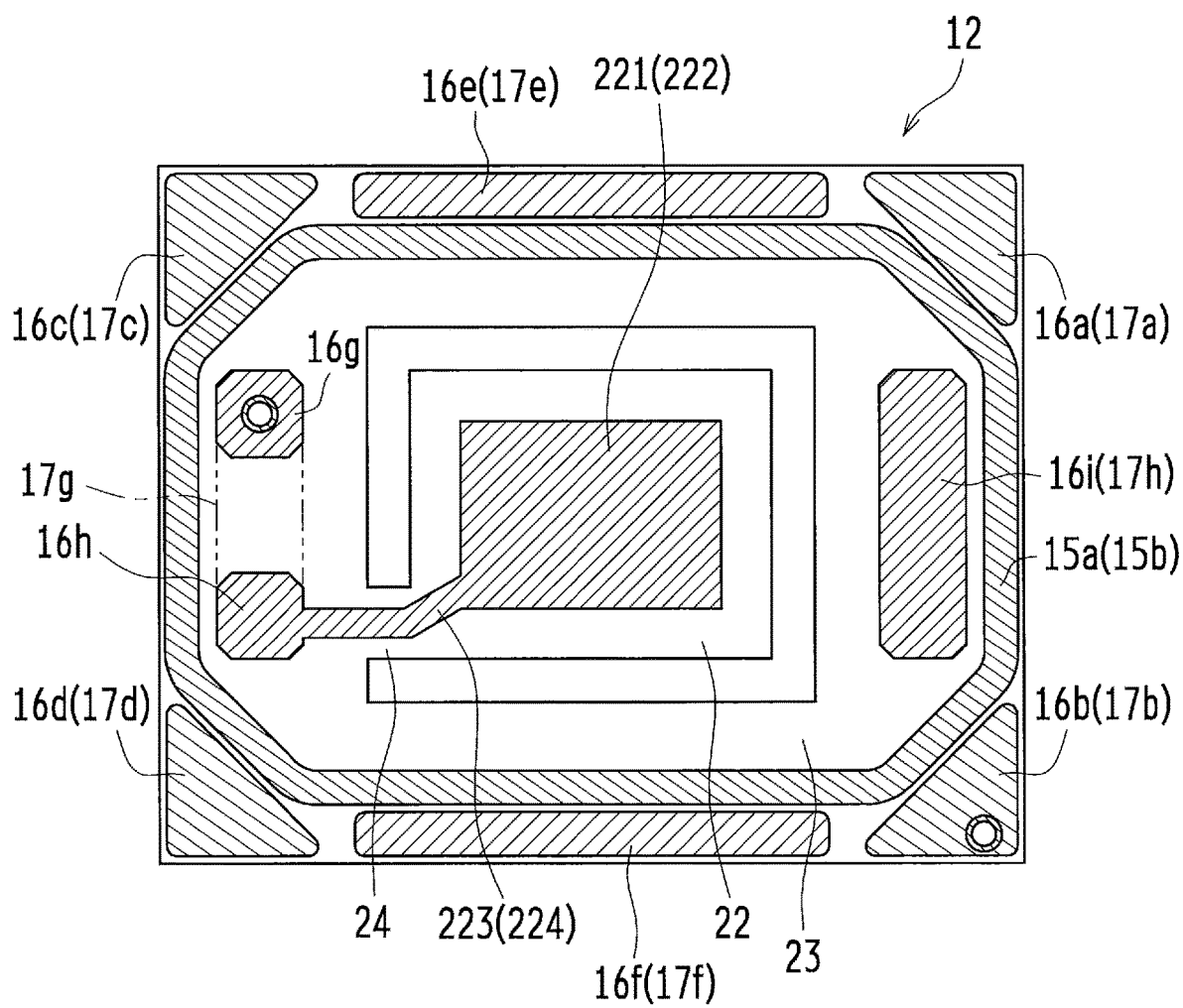
FIG. 8 is a diagram illustrating respective positional relationships in plan view among bonding materials in the crystal oscillator.

As shown in FIGS. 1 and 8, the resonator-plate-side first bonding pattern 251 and the sealing-member-side first bonding pattern 321 themselves serve as a bonding material 15a formed upon the diffusion bonding. The resonator-plate-side second bonding pattern 252 and the sealing-member-side second bonding pattern 421 themselves serve as a bonding material 15b formed upon the diffusion bonding.

In this case, the respective connection bonding patterns as described above are also subjected to the diffusion bonding in a state in which they are each superimposed on the corresponding connection bonding pattern. Specifically, the connection bonding patterns 111 to 114 at the four corners of the crystal resonator plate 2 and the connection bonding patterns 128 to 131 at the four corners of the first sealing member 3 are subjected to the diffusion bonding. The connection bonding patterns 118 and 119 on the regions close to the respective long sides of the crystal resonator plate 2 and the connection bonding patterns 135 and 136 on the regions close to the respective long sides of the first sealing member 3 are subjected to the diffusion bonding. The connection bonding pattern 115 of the crystal resonator plate 2 and the connection bonding pattern 132 of the first sealing member 3 are subjected to the diffusion bonding. The connection bonding pattern 116 of the crystal resonator plate 2 and the connection bonding pattern 133 of the first sealing member 3 are subjected to the diffusion bonding. The connection bonding pattern 117 of the crystal resonator plate 2 and the connection bonding pattern 134 of the first sealing member 3 are subjected to the diffusion bonding.

The connection bonding patterns 111 to 114 and the connection bonding patterns 128 to 131 themselves serve as bonding materials 16a to 16d formed upon the diffusion bonding. The connection bonding patterns 118 and 119, and the connection bonding patterns 135 and 136 themselves serve as bonding materials 16e and 16f formed upon the diffusion bonding. The connection bonding pattern 115 and the connection bonding pattern 132 themselves serve as a bonding material 16g formed upon the diffusion bonding. The connection bonding pattern 116 and the connection bonding pattern 133 themselves serve as a bonding material 16h formed upon the diffusion bonding. The connection bonding pattern 117 and the connection bonding pattern 134 themselves serve as a bonding material 16i formed upon the diffusion bonding. These bonding materials 16a to 16i serve, in addition to a function to bond the crystal resonator plate 2 to the first sealing member 3, to establish conduction between the through electrodes of the through holes, and to prevent generation of deformation (bending) in the first sealing member 3 when the crystal resonator plate 2 is bonded to the first sealing member 3.

Similarly to the above, the connection bonding patterns 120 to 123 at the four corners of the crystal resonator plate 2 and the connection bonding patterns 137 to 140 at the four corners of the second sealing member 4 are subjected to the diffusion bonding. The connection bonding patterns 126 and 127 on the regions close to the respective long sides of the crystal resonator plate 2 and the connection bonding patterns 143 and 144 on the regions close to the respective long sides of the second sealing member 4 are subjected to the diffusion bonding. The connection bonding pattern 124 of the crystal resonator plate 2 and the connection bonding pattern 142 of the second sealing member 4 are subjected to the diffusion bonding. The connection bonding pattern 125 of the crystal resonator plate 2 and the connection bonding pattern 141 of the second sealing member 4 are subjected to the diffusion bonding.

The connection bonding patterns 120 to 123 and the connection bonding patterns 137 to 140 themselves serve as bonding materials 17a to 17d formed upon the diffusion bonding. The connection bonding patterns 126 and 127, and the connection bonding patterns 143 and 144 themselves serve as bonding materials 17e and 17f formed upon the diffusion bonding. The connection bonding pattern 124 and the connection bonding pattern 142 themselves serve as a bonding material 17g formed upon the diffusion bonding. The connection bonding pattern 125 and the connection bonding pattern 141 themselves serve as a bonding material 17h formed upon the diffusion bonding. These bonding materials 17a to 17h serve, in addition to a function to bond the crystal resonator plate 2 to the second sealing member 4, to establish conduction between the through electrodes of the through holes, and to prevent generation of deformation (bending) in the second sealing member 4 when the crystal resonator plate 2 is bonded to the second sealing member 4.

In the crystal oscillator 101, the first excitation electrode 221 is connected to the IC chip 5 via a first electrical path, and the second excitation electrode 222 is connected to the IC chip 5 via a second electrical path. The first electrical path is constituted of the first extraction electrode 223, the bonding material 16h, the through electrode 155a, and the electrode pattern 372. The second electrical path is constituted of the second extraction electrode 224, the bonding material 17g, the through electrode 152a, the bonding material 16g, the wiring pattern 33, the bonding material 16i, the through electrode 154a, and the electrode pattern 372.

The shield electrode 431 formed on the second main surface 412 of the second sealing member 4 is to prevent capacitive coupling between signal wiring that exists in the circuit board and the excitation electrodes/internal wiring inside the crystal oscillator 101. When capacitive coupling occurs between the signal wiring outside the package and the excitation electrodes/internal wiring inside the package, potential change in the signal wiring may affect the device, which results in characteristic variations such as a frequency variation. For example, in the case in which the circuit board on which the crystal oscillator 101 is mounted is a multilayer printed circuit board, the signal wiring may exist on the region that is superimposed on the first excitation electrode 221 and the second excitation electrode 222. In the piezoelectric resonator device having the sandwich structure, the package is thin. Thus, the capacitive coupling easily occurs, which results in non-negligible capacitive coupling between the signal wiring in the circuit board and the first and second excitation electrodes 221 and 222 inside the crystal oscillator 101. In order to prevent the capacitive coupling, it is necessary to provide the shield electrode 431.

A fixed potential, which does not fluctuate during operation of the crystal oscillator 101, should be applied to the shield electrode 431. It is preferable that a GND (ground) potential is used as the fixed potential. For this reason, the shield electrode 431 is electrically connected to one of the electrode patterns 371 formed on the first main surface 311 of the first sealing member 3 via a third electrical path. That is, the electrode pattern 371 that is connected to the shield electrode 431 is wiring to apply the GND potential to the IC chip 5. Thus, the GND potential is constantly applied to the shield electrode 431. The third electrical path is constituted of the through electrode 153a, the bonding material 16b, the through electrode 151a, the bonding material 17b and the through electrode 156a.

In the crystal oscillator 101 with the above-described configuration, the IC chip 5 is mounted on the outer surface (i.e. on the first main surface 311) of the first sealing member 3, and furthermore, mounting pads (electrode patterns 371) for wire bonding are formed on the same surface for mounting the IC chip. In this way, by disposing the mounting pads for wire bonding, it is possible to provide the crystal oscillator 101 for wire bonding, not the surface mount type crystal oscillator. Since the crystal oscillator 101 is mounted by wire bonding, it can be easily housed in the package by the SiP method.

Also, on the mounting surface for wire bonding, a certain height is needed to pull up the wire. Meanwhile, on the surface on which the IC chip is mounted, a certain height is needed as the thickness of the IC chip 5. Accordingly, it is possible to prevent the height of the device as the crystal oscillator 101 from increasing by mounting the IC chip and the wire bonding pads on the same surface.

Also, since the mounting pads for wire bonding are provided on the outer surface of the first sealing member 3, the outer surface (the second main surface 412) of the second sealing member 4 does not have any mounting terminals and the like, thus, this outer surface is used as a bonding surface to the circuit board. Thus, if the circuit board (for example, a multilayer printed circuit board) includes signal wiring that faces the first excitation electrode 221 and the second excitation electrode 222, it is possible to prevent the capacitive coupling between the excitation electrodes and the signal wiring by providing the shield electrode 431 on the outer surface of the second sealing member 4. In the crystal oscillator 101 having the sandwich structure, the capacitive coupling is likely to occur between the first and second excitation electrodes 221 and 222, and other wiring due to the thin structure. Therefore, the above-described shielding measure is effective.

In the crystal oscillator 101 having the sandwich structure, the capacitive coupling may also occur between the electrode patterns formed on the first sealing member 3 and the first and second excitation electrodes 221 and 222. In order to prevent characteristic variations of the crystal oscillator 101 caused by the capacitive coupling, it is preferable that the mounting pads for wire bonding are arranged such that they are not superimposed on the first excitation electrode 221 and the second excitation electrode 222 (or such that the superimposed region is as small as possible) in plan view. Similarly to the above, it is preferable that the mounting pads on which the IC chip 5 is mounted are arranged such that they are not superimposed on the first excitation electrode 221 and the second excitation electrode 222 (or such that the superimposed region is as small as possible) in plan view. Furthermore, it is preferable that neither the other wiring on the first sealing member 3 (for example, the electrode patterns 371 and 372) nor the other wiring on the crystal resonator plate 2 (for example, the first extraction electrode 223, the second extraction electrode 224 and the wiring pattern 33) is superimposed on the other electrodes/wiring in plan view.

Also in the crystal oscillator 101, it is preferable that the mounting pads for wire bonding, which are respectively provided at the ends of the electrode patterns 371 on the respective peripheral sides, are arranged on regions that are superimposed on the external frame part 23 of the crystal resonator plate 2 in plan view. In this case, since the mounting pads are disposed so as to avoid the internal space of the crystal oscillator 101 and to face the external frame part 23, it is possible to prevent deformation of the crystal oscillator 101 by pressure at the time of wire bonding in the wire bonding step.

Figure 9:
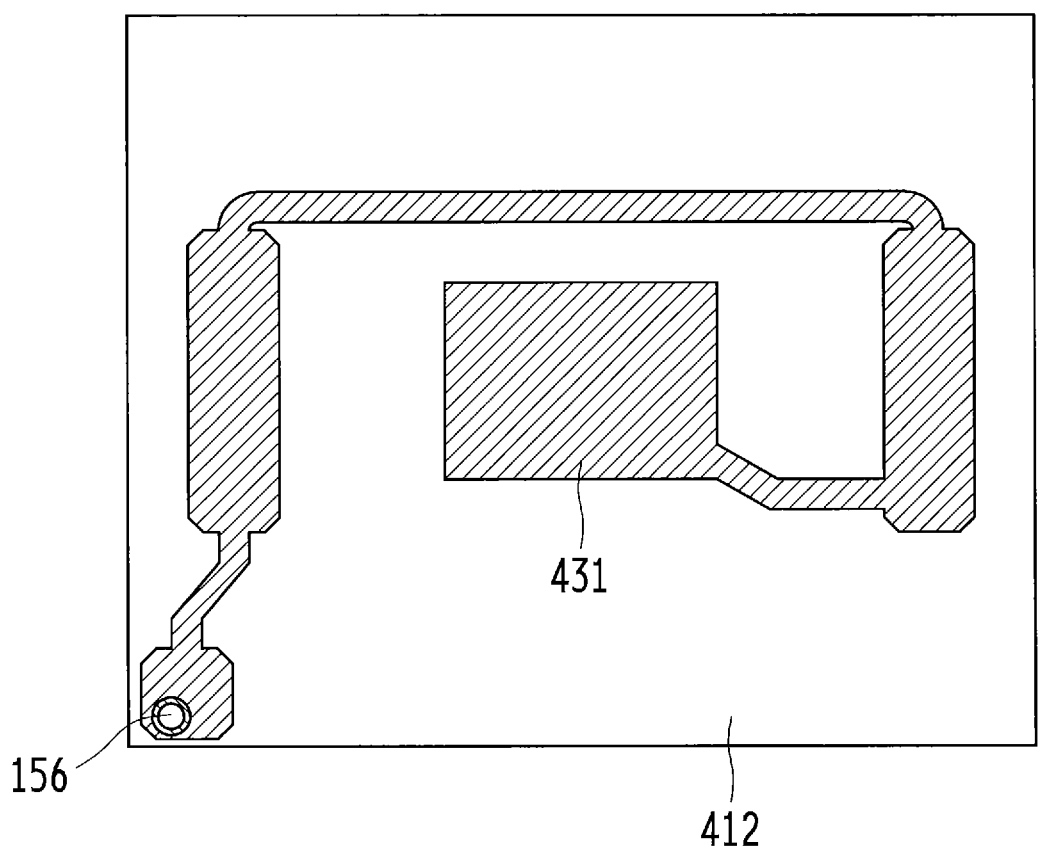
FIG. 9 is a schematic rear view illustrating a variation of the second sealing member of the crystal oscillator.

Also, the shield electrode 431 shown in FIG. 7 is formed over the substantially entire surface of the second main surface 412 of the second sealing member 4. However, the present invention is not limited thereto. The shield electrode 431 may be patterned in accordance with the shapes of the electrodes and wiring inside the crystal oscillator 101. FIG. 9 is a diagram illustrating an example in which the shield electrode 431 is patterned and formed in accordance with the respective shapes of the first and second excitation electrodes 221 and 222, the first and second extraction electrodes 223 and 224, the wiring pattern 33, and the bonding materials 16g to 16i, 17g and 17h.

In this way, by patterning the shield electrode 431 so as to conform with the shapes of the excitation electrodes and wiring to be shielded, it is possible to minimize the area for forming the shield electrode 431, which leads to reduction in parasitic capacitance generated by the shield electrode 431. When the parasitic capacitance is reduced, it is possible to prevent reduction in the frequency variable amount of the excitation electrode, which leads to the frequency easily controlled in the crystal oscillator 101.

Figure 10:
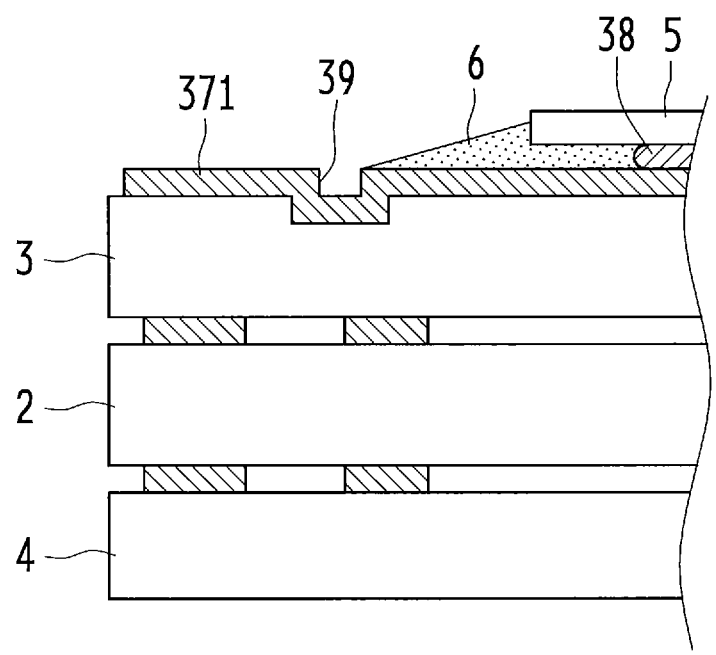
FIG. 10 is a schematic cross-sectional view illustrating a part in the vicinity of an IC chip mounting part in the crystal oscillator.
Figure 11:
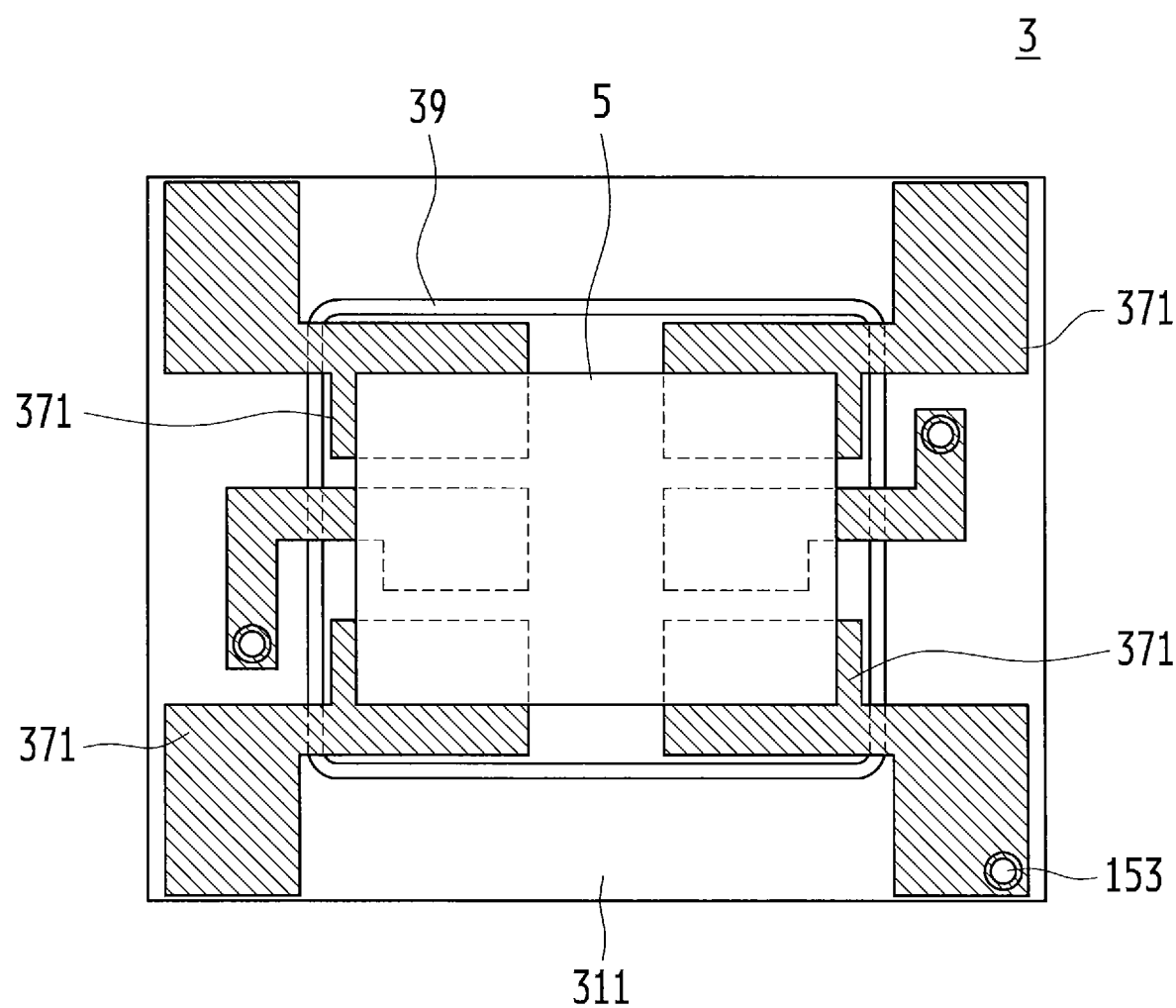
FIG. 11 is a schematic plan view illustrating a variation of the first sealing member of the crystal oscillator.
Figure 12:
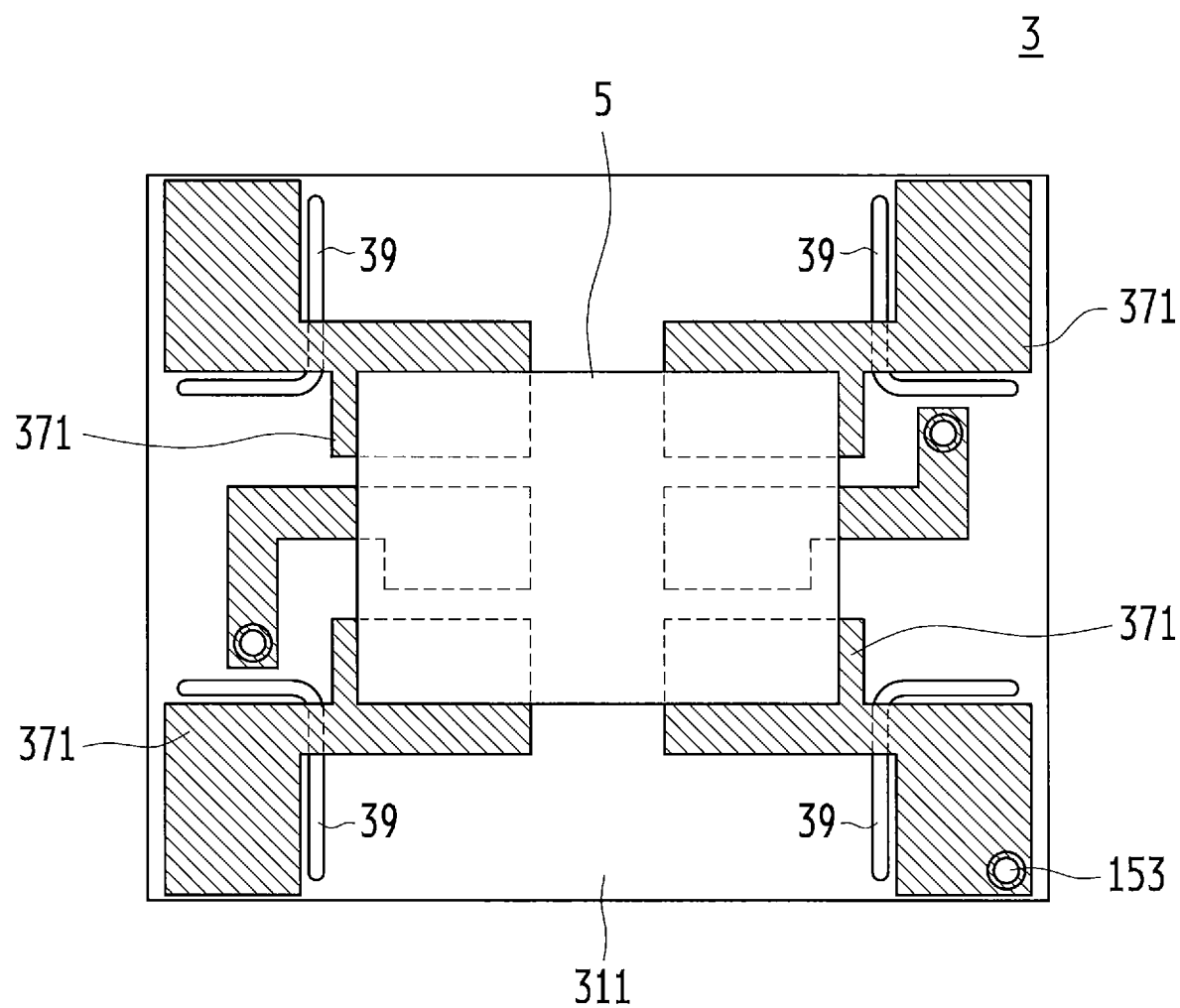
FIG. 12 is a schematic plan view illustrating a variation of the first sealing member of the crystal oscillator.

Also in the crystal oscillator 101, the IC chip 5 is mounted on the first sealing member 3. As shown in FIG. 10, the surrounding of the IC chip 5 is molded by a sealing resin 6. In this case, a groove 39 may be formed so as to prevent the sealing resin 6 from flowing over the mounting pads for wire bonding. The groove 39 may be formed so as to entirely surround the periphery of the IC chip 5 as shown in FIG. 11, or the multiple grooves 39 may be formed so as to respectively surround the mounting pads for wire bonding of the electrode patterns 371 as shown in FIG. 12.

Figure 13:
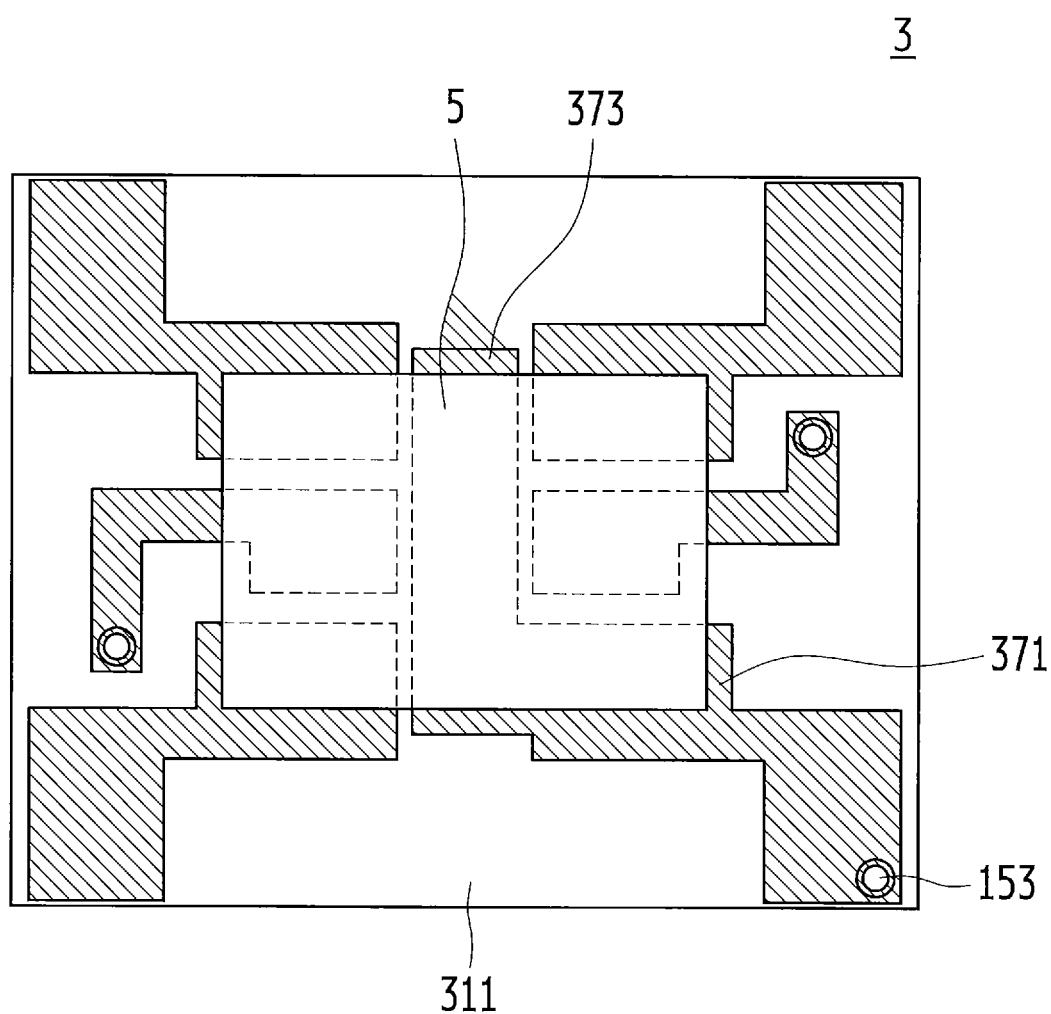
FIG. 13 is a schematic plan view illustrating a variation of the first sealing member of the crystal oscillator.
Figure 13:
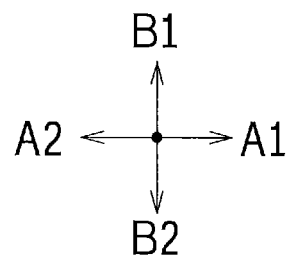

Also, a shield electrode 373 may be formed on the first main surface 311 of the first sealing member 3 as shown in FIG. 13, apart from the shield electrode 431 formed on the second main surface 412 of the second sealing member 4. The shield electrode 373 is to prevent potential fluctuations caused by the IC chip 5 and is disposed so as to cover an area on which neither the electrode patterns 371 nor the electrode patterns 372 are provided in the region on which the IC chip 5 is mounted. The shield electrode 373 is connected to one of the electrode patterns 371, more specifically, to the electrode pattern 371 disposed to apply the GND potential to the IC chip 5. Thus, the GND potential is constantly applied to the shield electrode 373.

Figure 14:
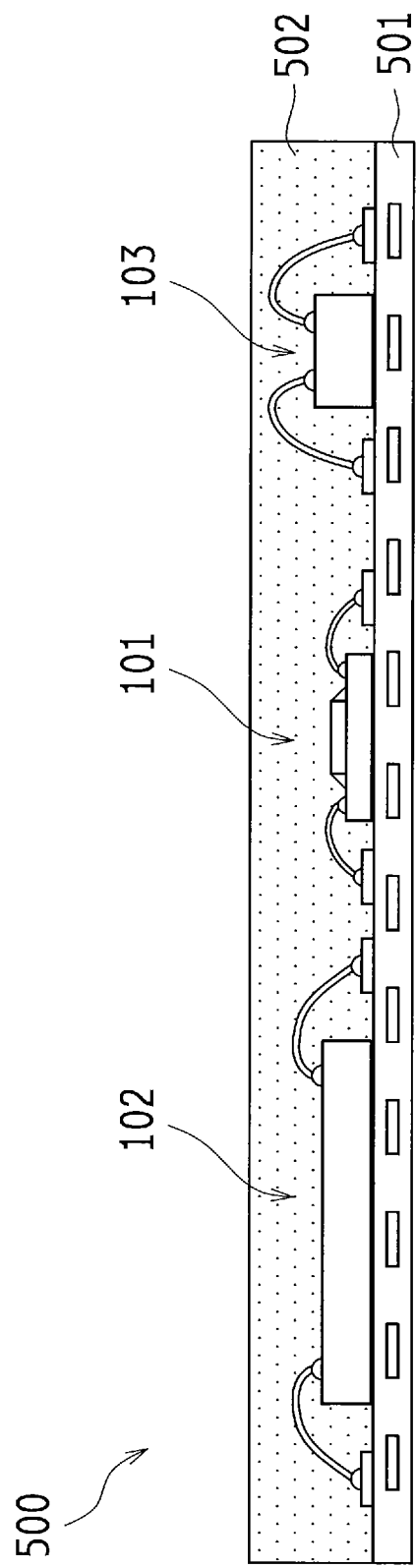
FIG. 14 is a cross-sectional view illustrating a schematic configuration of a SiP module using the crystal oscillator.

The crystal oscillator 101 according to this embodiment can be suitably applied to a SiP module in which a plurality of chips are sealed in one package. FIG. 14 is a cross-sectional view illustrating a schematic configuration of a SiP module 500 using the crystal oscillator 101.

In the SiP module 500 shown in FIG. 14, a plurality of chips are mounted on one circuit board 501. The crystal oscillator 101 is mounted as one of the chips. Also in the example shown in FIG. 14, LSI chips 102 and 103 are provided in the SiP module 500, in addition to the crystal oscillator 101. The LSI chips 102 and 103 are, for example, a processor and/or a memory chip. The number of the chips provided in the SiP module 500 is not particularly limited. Furthermore, the circuit board 501 may be a multilayer wiring board.

In the SiP module 500, it is preferable that the same mounting method is applied to the plurality of chips to be mounted. By applying the same chip mounting method, it is possible to prevent the steps of mounting the chips on the circuit board 501 from being complicated. In many cases, the various devices to be built in the SiP module are mounted on the circuit board by wire bonding. As the crystal oscillator 101 has mounting terminals for wire bonding, it can be suitably applied to the SiP module.

In the SiP module 500, respective rear surfaces of the crystal oscillator 101 and the LSI chips 102 and 103 are adhered to the circuit board 501 by adhesive or the like while the mounting terminals for wire bonding provided on respective front surfaces of the crystal oscillator 101 and the LSI chips 102 and 103 are connected to the wiring of the circuit board 501 by wire connection. Then, the surface of the circuit board 501 for mounting the chips is entirely sealed by a sealing resin 502. Thus, the crystal oscillator 101 and the LSI chips 102 and 103 are sealed in one package.

In the SiP module 500, when a crystal resonator is mounted on the circuit board 501 in place of the crystal oscillator 101, an IC chip, which constitutes an oscillator together with the crystal resonator, is also mounted on the circuit board 501 as a different chip from the crystal resonator. Thus, the crystal resonator and the IC chip are respectively mounted on the circuit board 501 by wire bonding, and then the crystal resonator and the IC chip are connected to each other so as to function as an oscillator.

In this embodiment, the first sealing member 3 and the second sealing member 4 are made of glass, however, the present invention is not limited thereto. They may be made of crystal. Also, the piezoelectric resonator plate is made of AT-cut crystal, however, it may be made of crystal other than the AT-cut crystal. Furthermore, the piezoelectric resonator plate may be made of any other material provided that it is a piezoelectric material (e.g. lithium niobate and lithium tantalite).

The first sealing member 3 and the second sealing member 4 are made of crystal, accordingly, the crystal resonator plate 2, the first sealing member 3 and the second sealing member 4 have the same coefficient of thermal expansion, which can prevent deformation of the package 12 caused by the difference in the coefficient of thermal expansion between the crystal resonator plate 2, the first sealing member 3 and the second sealing member 4. Thus, it is possible to improve hermeticity of the internal space 13 into which the vibrating part 22 of the crystal resonator plate 2 is hermetically shielded. Also, when the package 12 is deformed, such distortion is transmitted to the first excitation electrode 221 and the second excitation electrode 222 via the connecting part 24, which may cause frequency variations. However, it is possible to prevent such frequency variations by making all of the crystal resonator plate 2, the first sealing member 3 and the second sealing member 4 of crystal.

Also in this embodiment, the first sealing member 3 is bonded to the crystal resonator plate 2, and the crystal resonator plate 2 is bonded to the second sealing member 4, both by Au—Au diffusion bonding. However, the present invention is not limited thereto. They may be bonded to each other using brazing material.

The foregoing embodiment is to be considered in all respects as illustrative and not limiting. The scope of the invention is indicated by the appended claims rather than by the foregoing description, and all modifications and changes that come within the meaning and range of equivalency of the claims are intended to be embraced therein.

DESCRIPTION OF REFERENCE NUMERALS

101 Crystal oscillator (piezoelectric resonator device)
102, 103 LSI chip
2 Crystal resonator plate (piezoelectric resonator plate)
3 First sealing member
4 Second sealing member
5 IC chip
12 Package
13 Internal space
111-114 Connection bonding pattern
151-156 First to sixth through holes
22 Vibrating part
23 External frame part (frame body)
24 Connecting part
221 First excitation electrode
222 Second excitation electrode
371, 372 Electrode pattern
431 Shield electrode
500 SiP module
501 Circuit board

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
a mounting pad for wire bonding is formed on an outer surface of the first sealing member, and
a shield electrode is formed on an outer surface of the second sealing member.

2. The piezoelectric resonator device according to claim 1, wherein
the mounting pad for wire bonding is disposed so as not to be superimposed on the first excitation electrode and the second excitation electrode.

3. The piezoelectric resonator device according to claim 1, wherein
an IC chip is mounted on the outer surface of the first sealing member.

4. The piezoelectric resonator device according to claim 3, wherein
a groove is formed so as to surround the mounting pad for wire bonding.

5. A SiP module comprising the piezoelectric resonator device according to claim 1.

6. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
a mounting pad for wire bonding is formed on an outer surface of the first sealing member,
an IC chip is mounted on the outer surface of the first sealing member, and
a terminal on which the IC chip is mounted is formed on the outer surface of the first sealing member so as not to be superimposed on the first excitation electrode and the second excitation electrode.

7. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
a mounting pad for wire bonding is formed on an outer surface of the first sealing member, and
the mounting pad for wire bonding is disposed so as to face a frame body surrounding the internal space.

* * * * *